United States Patent
Watson et al.

(10) Patent No.: US 8,783,463 B2
(45) Date of Patent: Jul. 22, 2014

(54) WAFER CONTAINER WITH TUBULAR ENVIRONMENTAL CONTROL COMPONENTS

(75) Inventors: James A. Watson, Eden Prairie, MN (US); John Burns, Colorado Springs, CO (US); Martin L. Forbes, Divide, CO (US); Matthew A. Fuller, Colorado Springs, CO (US); Mark V. Smith, Colorado Springs, CO (US)

(73) Assignee: Entegris, Inc., Billerica, MA (US)

( * ) Notice: Subject to any disclaimer, the term of this patent is extended or adjusted under 35 U.S.C. 154(b) by 982 days.

(21) Appl. No.: 12/922,408

(22) PCT Filed: Mar. 13, 2009

(86) PCT No.: PCT/US2009/037143
§ 371 (c)(1),
(2), (4) Date: Dec. 17, 2010

(87) PCT Pub. No.: WO2009/114798
PCT Pub. Date: Sep. 17, 2009

(65) Prior Publication Data
US 2011/0114534 A1 May 19, 2011

Related U.S. Application Data

(60) Provisional application No. 61/036,353, filed on Mar. 13, 2008.

(51) Int. Cl.
*B65D 85/00* (2006.01)

(52) U.S. Cl.
USPC .......................................... 206/710; 206/454

(58) Field of Classification Search
USPC .......... 206/701, 710, 711, 454, 449; 118/500; 414/217, 217.1, 935, 940
See application file for complete search history.

(56) References Cited

U.S. PATENT DOCUMENTS 4,745,088 A * 5/1988 Inoue et al. ................. 117/98
5,346,518 A 9/1994 Baseman et al.
(Continued)

FOREIGN PATENT DOCUMENTS

JP 11-307623 11/1999
JP 2001-516500 A 9/2001
(Continued)

*Primary Examiner* — Jacob K Ackun
*Assistant Examiner* — Jenine Pagan
(74) *Attorney, Agent, or Firm* — Christensen Fonder P.A.

(57) ABSTRACT

A wafer container utilizes a rigid polymer tubular tower with slots and a "getter" therein for absorbing and filtering moisture and vapors within the wafer container. The tower preferably utilizes a purge grommet at the base of the container and may have a check valve therein to control the flow direction of gas (including air) into and out of the container and with respect to the tower. The tower is sealingly connected with the grommet. The tower may have a getter media piece rolled in an elongate circular fashion forming or shaped as a tube and disposed within the tower and may have axially extending. The media can provide active and/or passive filtration as well as having capabilities to be recharged. Front opening wafer containers for 300 mm sized wafers generally have a pair of recesses on each of the left and right side in the inside rear of the container portions. These recesses are preferably utilized for elongate towers, such towers extending substantially from a bottom wafer position to a top wafer position. In alternative embodiment, a tubular shape of getter material is exposed within the front opening container without containment of the getter other than at the ends. The tubular getter form is preferably supported at discrete locations to maximize exposure to the internal container environment. A blocker member can selectively close the apertures. An elastomeric cap can facilitate securement of the tubular component in the container portion.

28 Claims, 8 Drawing Sheets

(56) References Cited

U.S. PATENT DOCUMENTS

| | | | |
|---|---|---|---|
| 5,960,959 A * | 10/1999 | Wu et al. | 206/710 |
| 6,042,651 A | 3/2000 | Roberson, Jr. et al. | |
| 6,368,411 B2 * | 4/2002 | Roberson et al. | 118/715 |
| 6,758,876 B2 * | 7/2004 | Suzuki et al. | 55/385.6 |
| 7,900,776 B2 * | 3/2011 | Burns et al. | 206/711 |
| 8,318,275 B2 * | 11/2012 | Kudo et al. | 428/35.7 |
| 2002/0038773 A1 * | 4/2002 | Fujimori et al. | 206/454 |
| 2004/0182472 A1 | 9/2004 | Aggarwal | |
| 2005/0077204 A1 * | 4/2005 | Sumi et al. | 206/710 |
| 2005/0115866 A1 * | 6/2005 | Burns et al. | 206/710 |
| 2005/0252827 A1 * | 11/2005 | Tieben et al. | 206/710 |
| 2006/0207916 A1 * | 9/2006 | Mimura et al. | 206/710 |
| 2006/0283774 A1 * | 12/2006 | Hasegawa et al. | 206/725 |
| 2009/0026109 A1 * | 1/2009 | Hasegawa et al. | 206/711 |
| 2009/0206001 A1 * | 8/2009 | Sasaki et al. | 206/711 |

FOREIGN PATENT DOCUMENTS

| | | |
|---|---|---|
| JP | 2002-170874 A | 6/2002 |
| JP | 2003-168728 A | 6/2003 |
| JP | 2004-22674 A | 1/2004 |
| JP | 2006-128461 A | 5/2006 |
| KR | 10-2004-0002969 A | 1/2004 |
| WO | WO 2007/149513 A2 | 12/2007 |

* cited by examiner

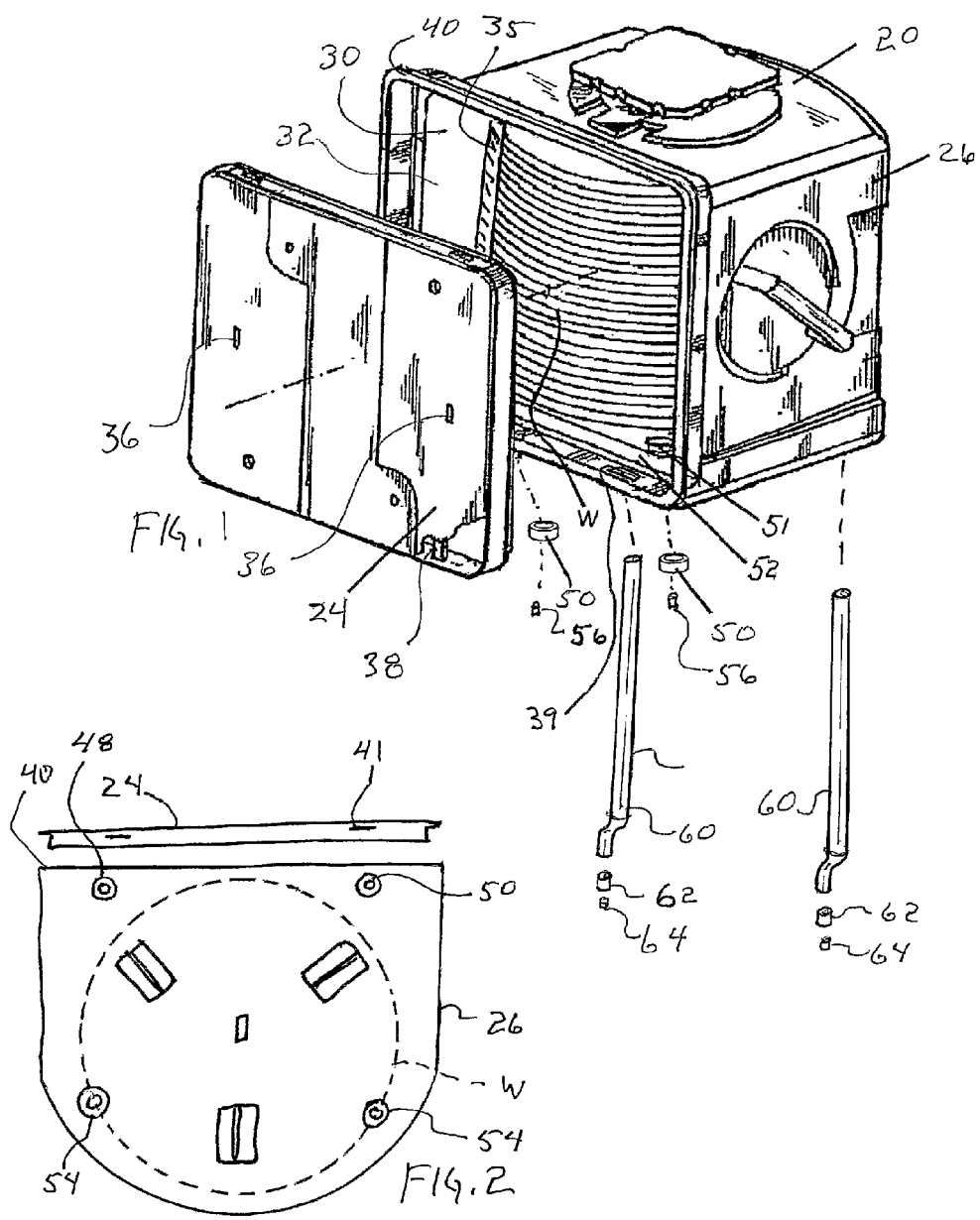

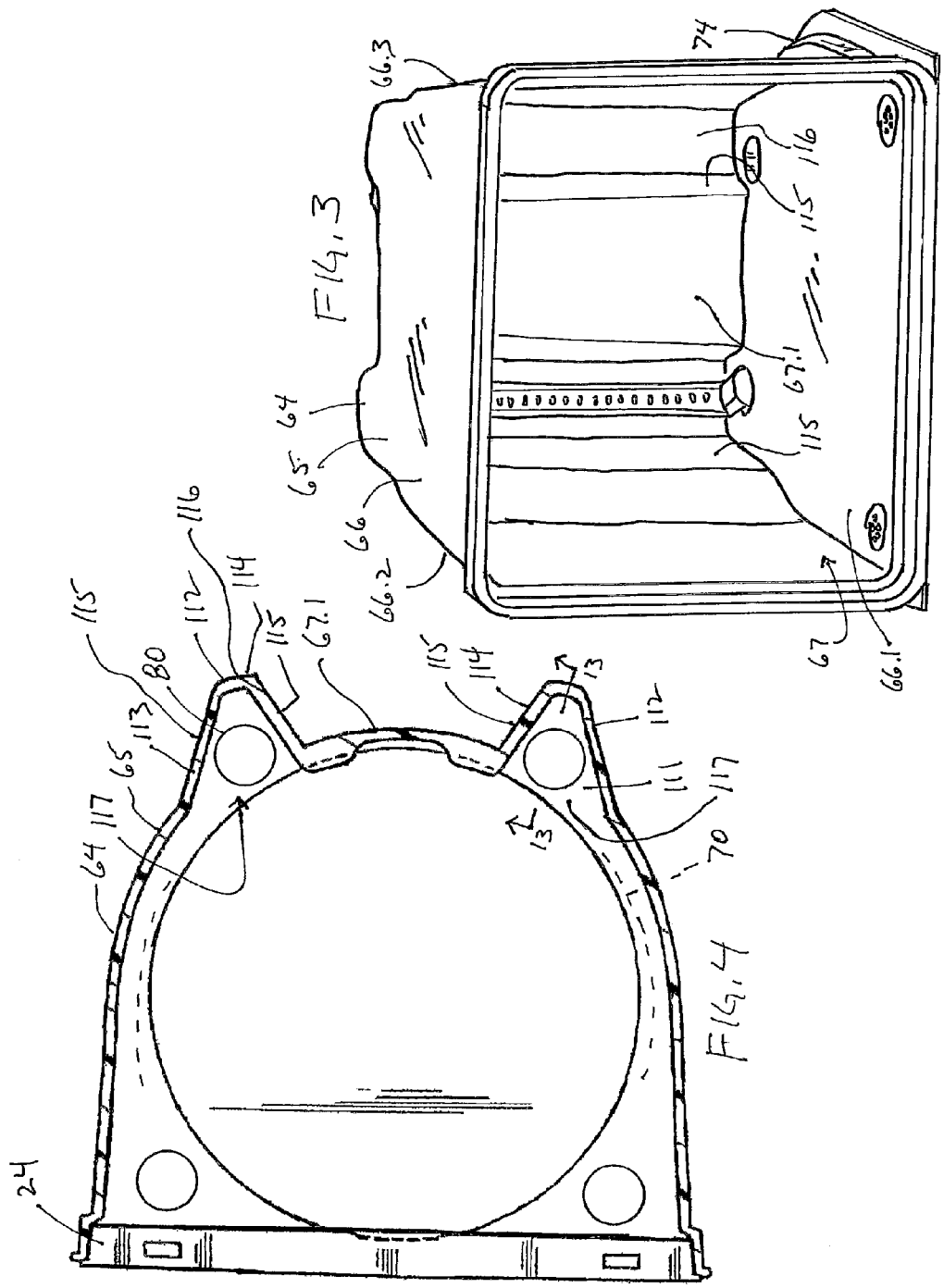

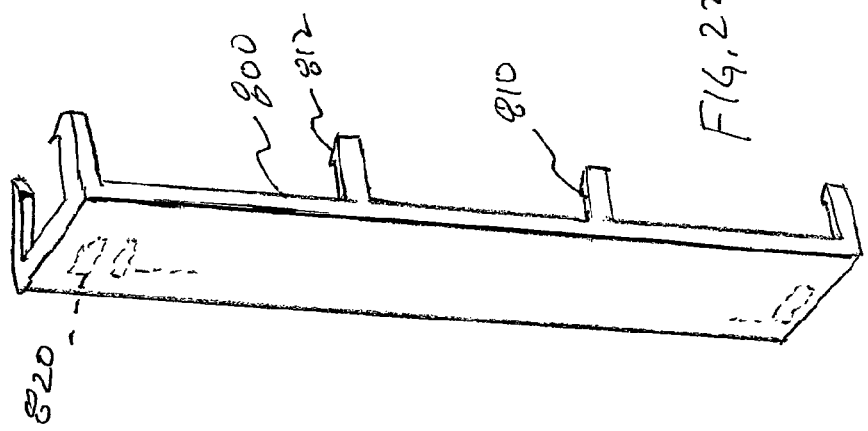
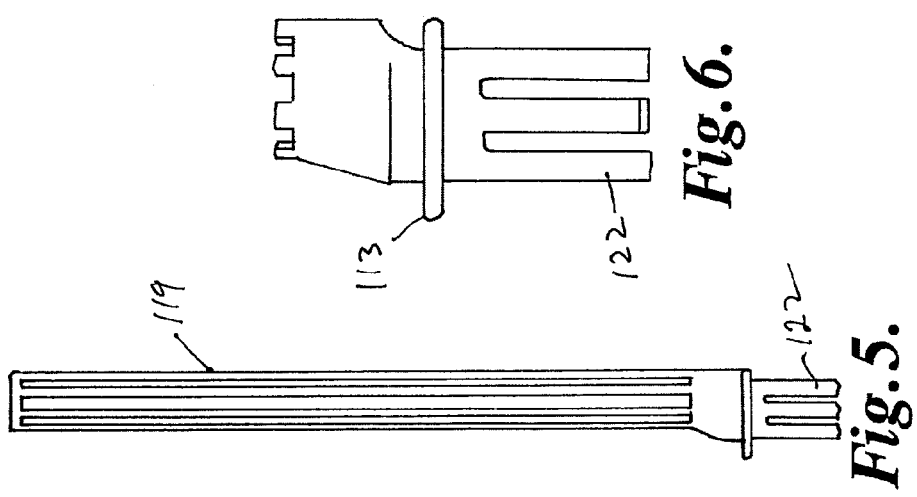

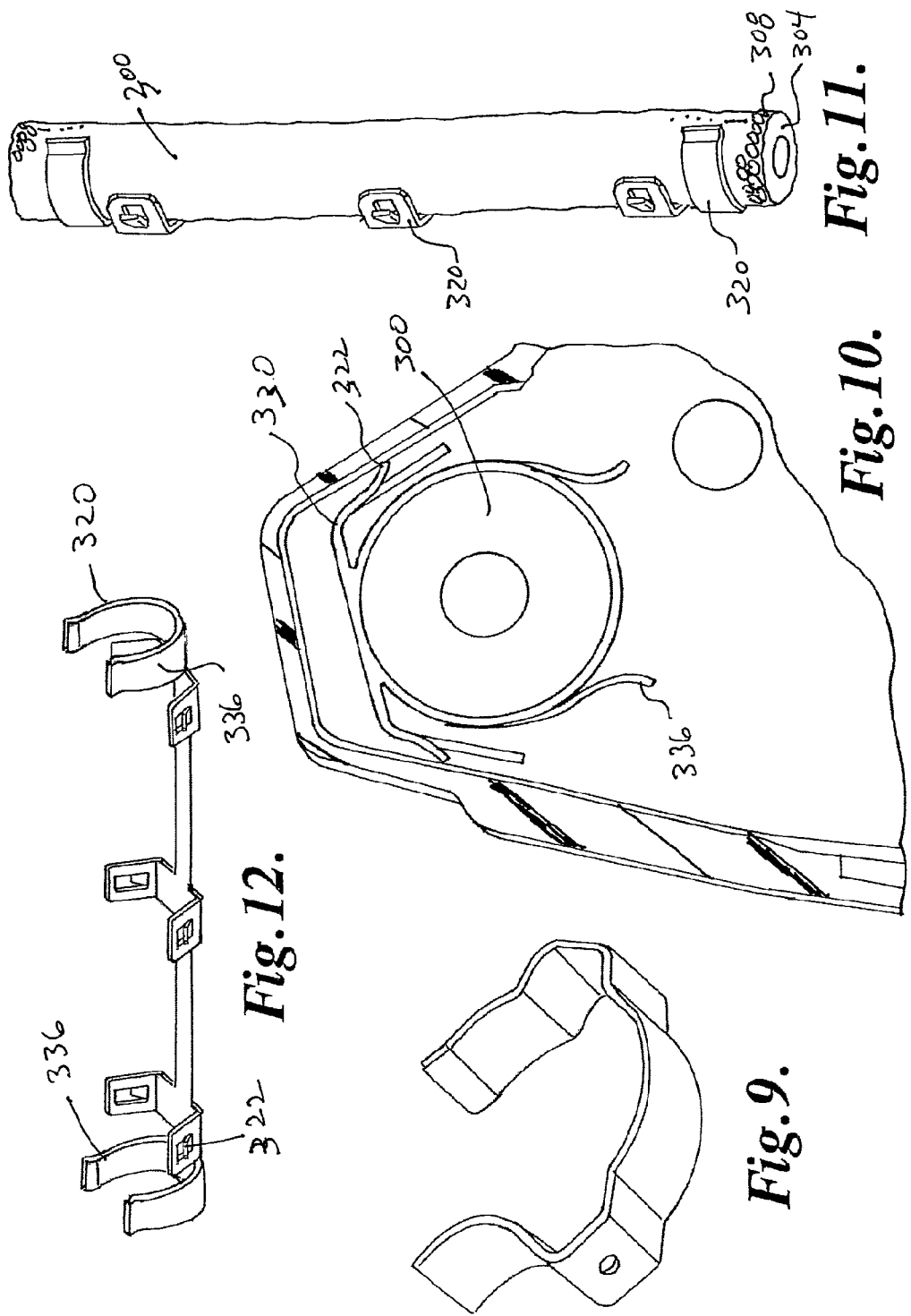

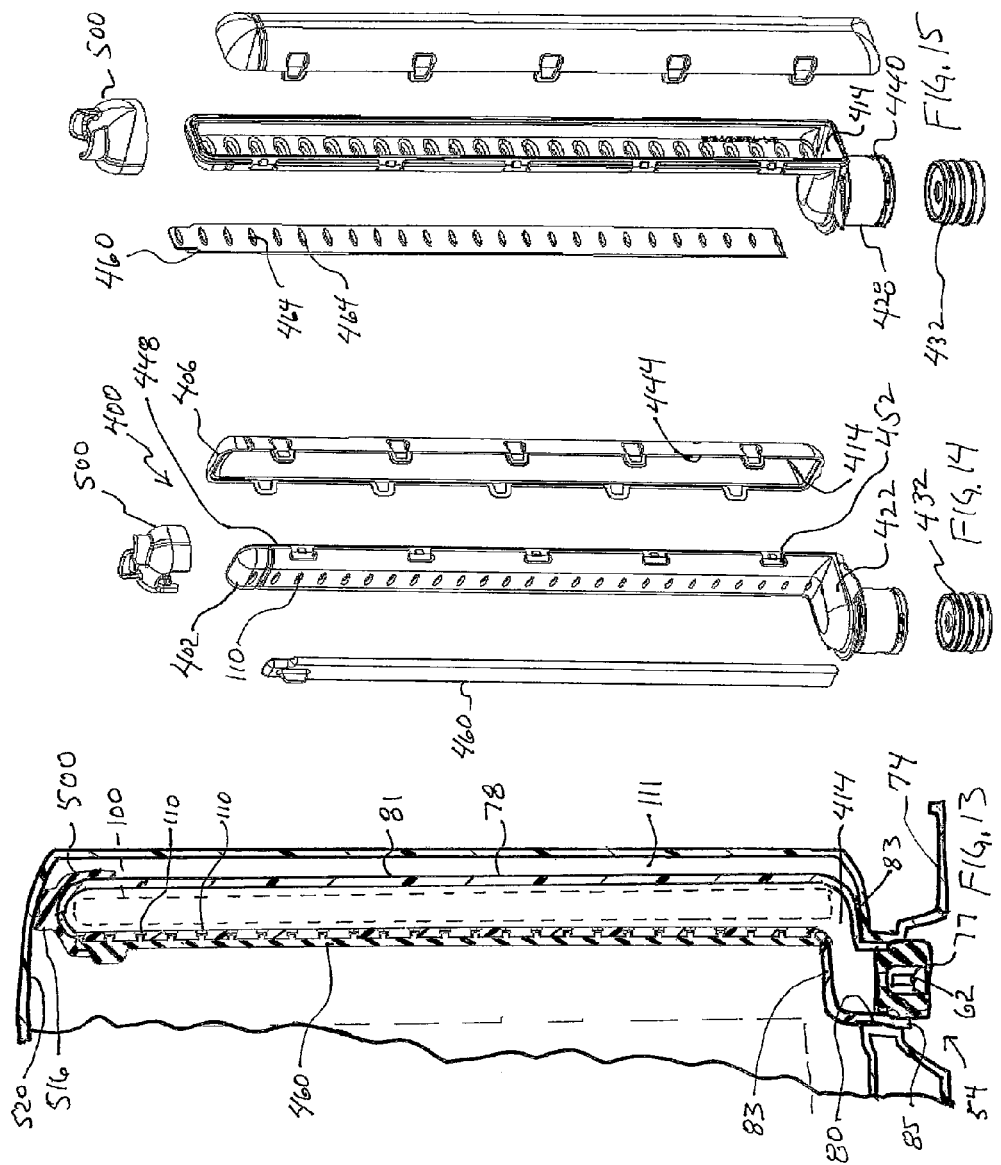

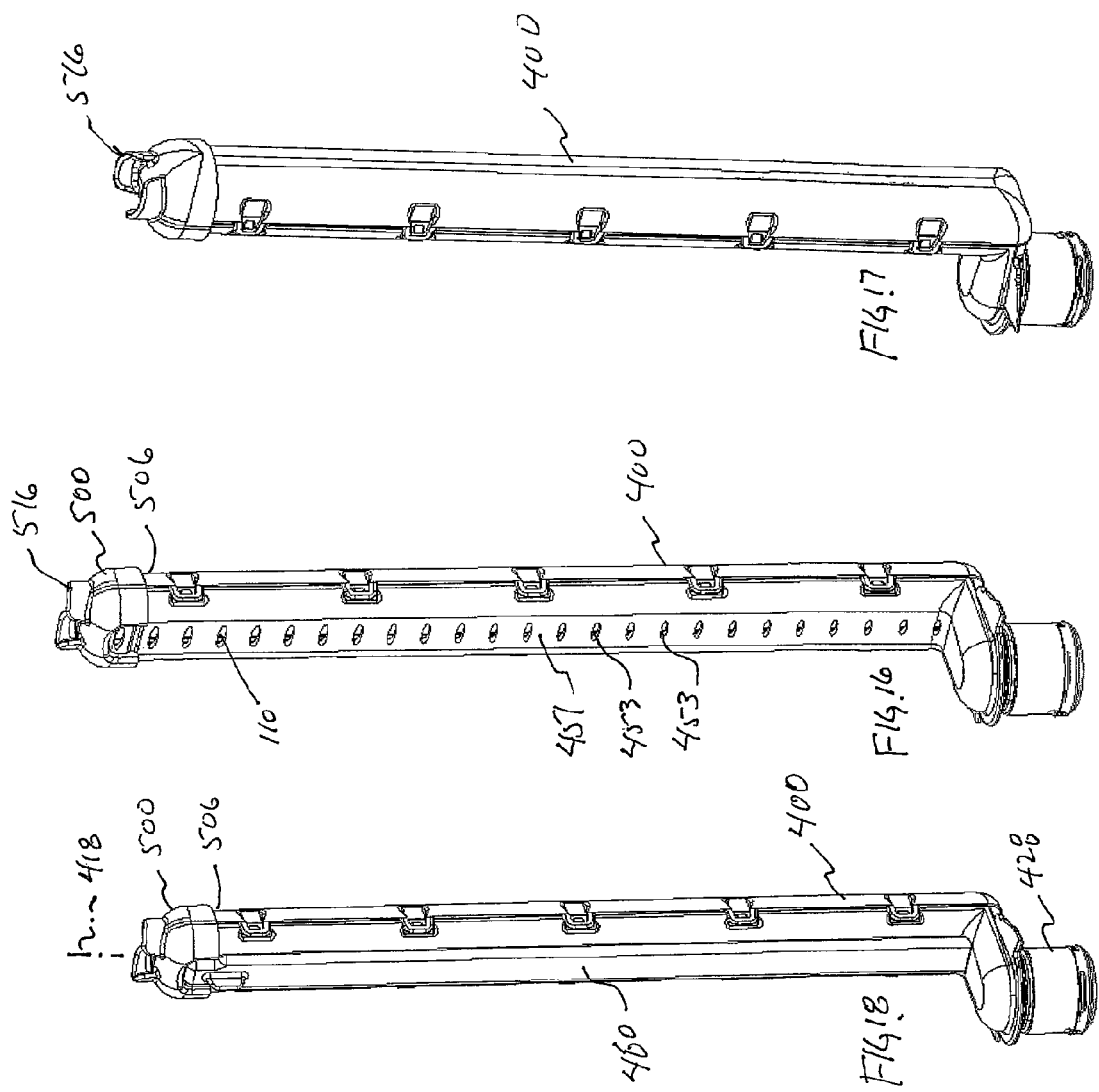

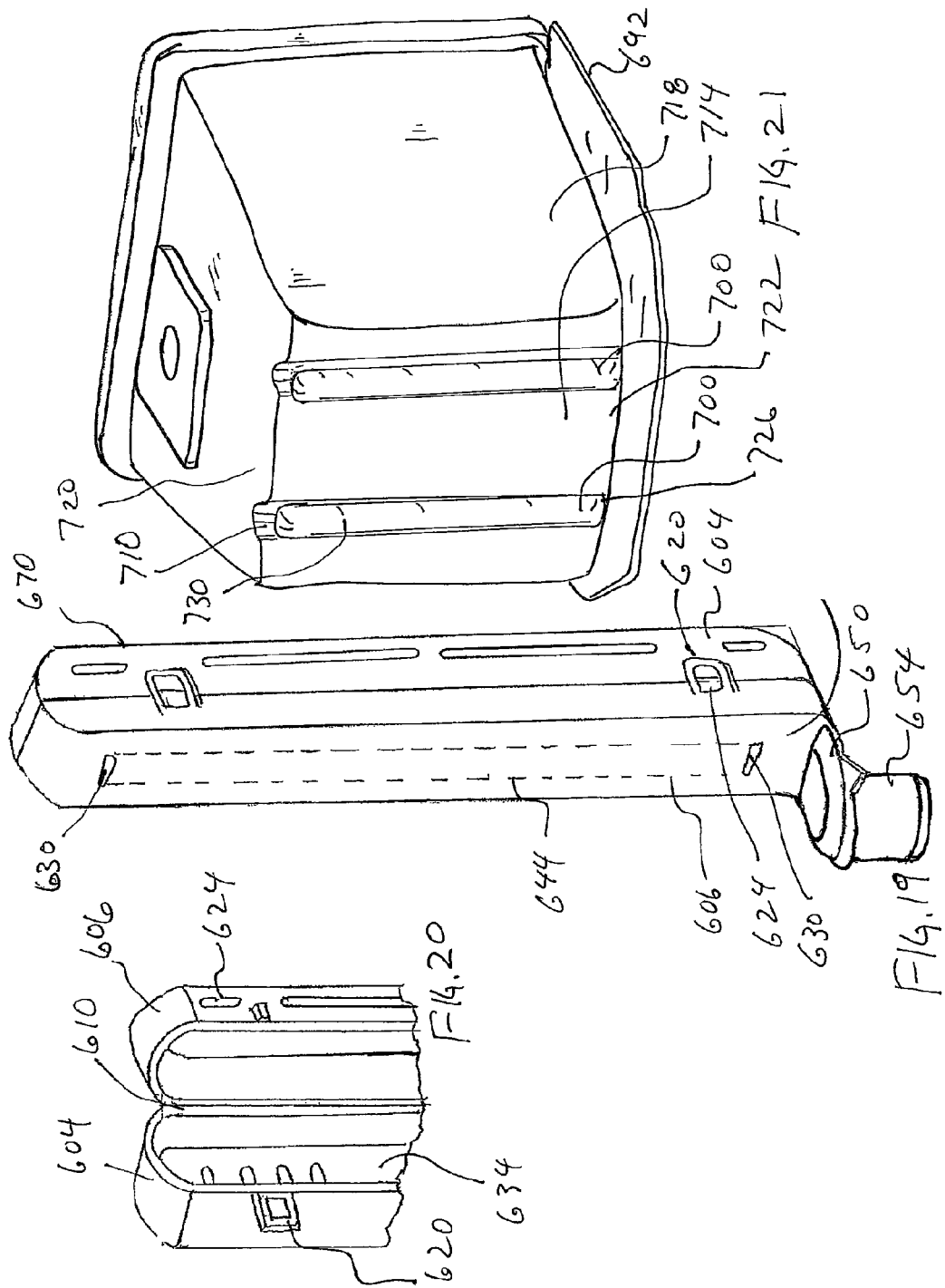

WAFER CONTAINER WITH TUBULAR ENVIRONMENTAL CONTROL COMPONENTS

PRIORITY CLAIM

The present application is a National Phase entry of PCT Application No. PCT/US2009/037143, filed Mar. 13, 2009, which claims priority from U.S. Provisional Application No. 61/036,353, filed Mar. 13, 2008, the disclosures of which are hereby incorporated by reference herein in their entirety.

BACKGROUND OF THE INVENTION

Wafer containers and reticle pods generally are sealed containers known as FOUPs (front opening unified pods), FOSBs (front opening shipping boxes), or SMIF (standard mechanical interface) pods. These containers provide a microenvironment to isolate and control the environment surrounding a wafers and substrates used in manufacturing integrated circuits, during storage, transport and processing of the materials. Processing of such materials traditionally has been carried out in a particulate free environment generally known as a "clean room". However, maintenance of such "clean rooms" in a contaminant free state can require a great deal of care and effort, particularly during processing of the materials.

The internal atmosphere of such microenvironments can be more readily controlled and maintained. Often, such containers are purgible with inert gas or clean dry air (CDA) or extra CDA. It has been observed that contamination of reticles in such containers can be caused not only by discrete particles but also by hazing occurring on wafers or reticles. See Publication WO 2007/149513 A2, owned by the owner of the instant application, which is incorporated herein by reference and included in the Appendix to this application. Such hazing can also occur on wafers in wafer containers and be detrimental thereto, see U.S. Pat. No. 5,346,518 which is incorporated herein by reference. Also relevant, U.S. Pat. No. 6,042,651, owned by the owner of the instant application, discloses using nozzled towers in bottom opening SMIF pods and a front opening wafer container that uses wafer shelf assemblies as purge outlets. Problems associated with such structures and optimal use of such structures has not been adequately addressed.

For example, the use of desiccants and vapor getters in substrate containers typically require removal or disassembly of same before washing and such substrate containers as the fluids utilized can destroy the media for filtering and/or vapor absorption. Moreover, purge port plumbing within substrate containers is, aside from the media issues, difficult to clean and dry due to the enclosed areas used for transferring purge gases. A means for facilitating cleaning of such substrate containers without disassembly and removal of media and purge components would be very advantageous. Particularly, problematic in cleaning are free standing towers such as disclosed in U.S. Pat. No. 6,042,651. Moreover, such towers are subject to movement and potential dislocation due to their conventional positioning where they may be inadvertently contacted and their connection only at the base of the substrate container. Better positioning and attachment methods and structures would be advantageous, particularly methods that do not rely on holes or fasteners that extend through walls or other barriers separating the enclosed interior of the container from the exterior.

The use of discrete towers in a front opening pod, the use of more than one discharge tower, and the optimal placement and securement of discharge towers or tubular environmental control components has not heretofore been adequately considered and optimized to satisfactorily address reliability, haze, contamination and particulate control, and cleaning issues in front opening large diameter wafer containers. As a transition is made from 300 mm wafers to 450 mm wafers, improvements in these areas will be even more important.

SUMMARY OF THE INVENTION

In an embodiment of the invention, a wafer container includes a tubular environmental control component that is configured with an open interior and slots communicating with the interior of the wafer container. One or two of the tubular component may be strategically placed in back corners or compartments of the wafer container and may be connected to purge inlets on the bottom of the wafer container. Certain embodiments may have a filter in addition to or alternatively to the absorbent material. In certain embodiment an additional purge inlet port may be utilized for a total of three purge inlets. The tubular components or the purge ports may have a check valve therein to control the flow direction of gas (including air) into and out of the container and with respect to the tower. The purge port may utilize an elastomeric grommet and the tubular component sealingly connected thereto. The tubular component may have a getter media piece rolled in an elongate circular fashion forming or shaped as a tube and disposed within the tower. The media can provide active and/or passive filtration as well as having capabilities to be recharged.

One configuration of front opening wafer containers for 300 mm sized wafers have a pair of compartments on each of the left and right side in the inside rear of the container portions. These compartments reflect the interior structure formed by the pair of vertical external projections on the back wall of wafer containers that are utilized as feet or seating features when the container portion is rotated rearward ninety degrees. A feature and advantage of certain embodiments is utilizing these compartments for containing, completely or partially, elongate tubular environmental control components that extend substantially from a bottom wafer position to a top wafer position or from the bottom of the container portion to the top. In one embodiment, a tubular shape of getter material is exposed within the front opening container in one or both compartments with minimal containment of the getter and without being part of an active purge system. In another embodiment, a tubular environmental control component configured as a purge tower may be placed in one or both compartments. The tower may be configured as a containment portion that may contain media. The media can be filter and/or absorbent media.

In particular embodiments, the tubular environmental control component has apertures either for exuding purge gas into the open interior of the container portion or for allowing absorbent media in the component to absorb vapors, including humidity from the interior of the container portion. A feature and advantage is that such apertures may be selectively obstructed to stop communication between the interior of the tubular component and the open interior of the wafer container. This is highly advantageous for washing the container so that filters, getters, or other contents of the tubular component can be protected from the washing fluids without removing the components. The obstruction may be by an elastomeric strip that seals the apertures as by a rigid slidably attached member that can cover and uncover the apertures. Moreover such selective blocking can be adjustable to change the size of the openings between the interior of the container portion and the interior of the tubular component.

A feature and advantage of certain embodiments is that the tubular component with apertures may be horizontally offset form the purge inlet connected thereto. This provides clearance with respect to the wafers. Moreover, positioning the discharge aperture in the tubular component back in the recess or compartment is believed to provide better fluid flow characteristics for the purge gas. Positioning the tubular components in the back recess provides the advantage of protection of the purge component from bumping or inadvertent contact.

A feature and advantage of certain embodiments is the methods of attachment of environmental control components in the rear compartments. These compartments reflect the interior structure formed by the pair of vertical external projections on the back wall of wafer containers that are utilized as feet or seating features when the container portion is rotated rearward ninety degrees. These internal compartments have walls that generally converge rearwardly. In a particular embodiment, a flexible elastomeric attachment member is secured intermediate the top of a tubular environmental control component and the polymer wall of the container portion. Such elastomeric attachment member secures the tower in place without apertures through the walls and optimally utilizes the high coefficient of friction between the polycarbonate container portion wall and the elastomeric material. The member may be shaped as a cap further providing the advantageous function of securing together elongate components that comprising the containment portion of tubular environmental control components. A tubular component may have such a member on both ends to utilize the high coefficient of friction and the compression of the elastomeric members to retain said tubular environmental control component within, totally or partially, the rearward compartment. In another embodiment a rigid bracket formed from metal or a rigid polymer may have spring teeth to wedge the bracket between opposing walls of the compartment wherein the teeth dig into the surface of the container portion wall. A feature and advantage of these attachment methods and structures is that the attachment utilizes the opposing walls for engagement of the attachment components without separate structure or fasteners that extend through walls of the wafer container. Therefore, wafer containers may be readily retrofitted with no modifications or reduced modifications to the product.

A feature and advantage of embodiments utilizing the tubular getter media is that a relatively high area of media is effectively exposed in a confined area in the wafer container. Moreover, the rear compartments work well for the tubular components that have no media and are utilized for pure purging.

A further feature and advantage of certain embodiments is that where purge gas is exhausted through the tower, the tubular getter media may be effectively recharged for periods when the environment therein is static.

A further feature and advantage of embodiments herein is that accommodation of the invention in existing configurations of 300 wafer containers requires minimal changes in such containers. A further feature and advantage is that aspects of the invention are highly suitable for larger wafer containers.

DESCRIPTION OF THE FIGURES

FIG. 1 is a perspective view of a front opening wafer container according to an embodiment of the invention;

FIG. 2 is a bottom view of the wafer container of FIG. 1;

FIG. 3 is a front perspective view into the open front of a different embodiment of a container portion;

FIG. 4 is a detail top view cross-sectional of the embodiment of FIG. 3 showing the location of tubular components and purge ports with respect to the walls of the container portion and wafers therein;

FIG. 5 is an elevational view of a tubular component;

FIG. 6 is a detail view of attachment features suitable for securing the tower component to the bottom wall of a container portion of a front opening wafer container;

FIG. 9 is a bracket suitable for attaching a tubular environmental control component to the back region of a wafer container such as is shown in FIGS. 4 and 5;

FIG. 10 is a top cross sectional view illustrating an attachment means for a tubular environmental control component of a wafer container;

FIG. 11 is a perspective view of a filter cartridge in a bracket;

FIG. 12 is a perspective view of the bracket of FIG. 11;

FIG. 13 is a cross sectional view taken at line 13-13 of FIG. 4;

FIG. 14 is an exploded view of a tubular environmental control component according to an embodiment of the invention;

FIG. 15 is an exploded view of a tubular environmental control component of the tubular environmental control component of FIG. 14;

FIG. 16 is a front side perspective view of a tubular environmental control component;

FIG. 17 is a rear side view of the tubular environmental control component of FIG. 16;

FIG. 18 is a front perspective view of the tubular environmental control component of FIGS. 16 and 17 with a blocking member engaged therewith;

FIG. 19 is a front side perspective view of a tubular environmental control component according to an embodiment of the invention;

FIG. 20 is a detail view of the tubular environmental control component of FIG. 19 opened revealing a living hinge;

FIG. 21 is a container portion according to an embodiment of the invention; and

FIG. 22 is a perspective view of an alternative embodiment of a blocking member 800 according to the present invention.

DETAILED DESCRIPTION OF PREFERRED EMBODIMENTS

Figure 8:
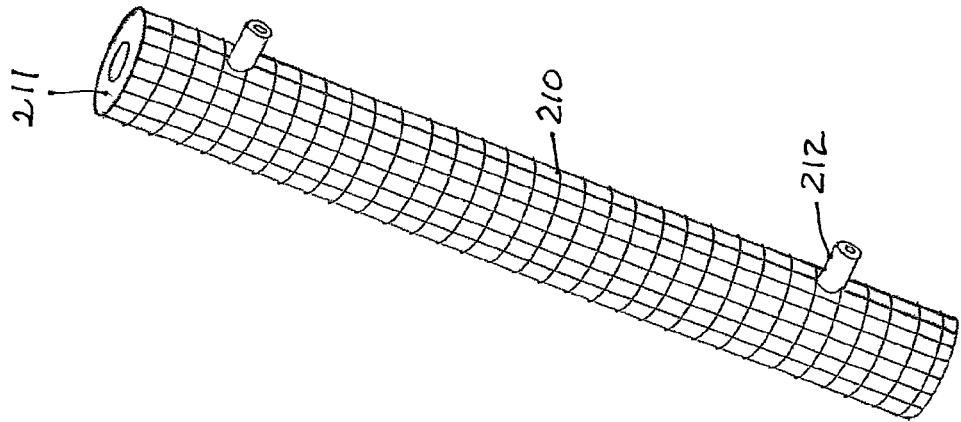
FIG. 8 is a perspective view of tubular environmental control components configured as an absorbent filter cartridge according to an embodiment of the present invention.

Referring to FIGS. 1 and 2, a front opening wafer container 20 is depicted and generally includes door 24 and container portion 26. Container portion 26 has front opening 30 leading into open interior 32 where a plurality of wafers W are retained on wafer shelves 35. Door 24 has key access holes 36 with latch mechanism 38 partially illustrated in the interior of the door enclosure with latch tips 41 that engage recesses 39 in the container portion door frame 40. The wafer container has purge capabilities with a pair of forward purge ports 48 with purge grommets 50 which are secured into grommet receiving structure 51 on the bottom 52 of the container portion and rearward purge ports 54. Check valves 56 may be inserted into the grommets to control the direction of purging gas fluid flow. Tubular environmental control components configured as purge towers 60 are illustrated which also may utilize grommets 62 and check valves 64. An exemplary location of purge ports is illustrated in FIG. 2 with reference to the wafers W.

Referring to FIGS. 3, 4, and 13, further details of a wafer container with a different configuration portion 64 embodying the inventions are illustrated with appropriate component placement. The container portion 64 has a shell 65 and closed top 66, a closed bottom 66.1, a closed left side 66.2, a closed right side 66.3, an open front 67, and a closed back 67.1. The interior of the container has a plurality of shelves 70 which may be secured to the container portion at the top and bottom of same. A kinematic coupling plate 74 (not shown in FIG. 4) is positioned at the bottom of the container portion and has appropriate openings for receiving the front side grommets and rear side grommet 77 at rear ports 54. The openings will extend through the shell 65. The container portion has two rearward apertures 80 which extend from the interior 32 of the wafer container to the exterior.

The tubular environmental control component 78 configured as a tower component as depicted in FIGS. 3 and 13 is inserted into the container portion 64 from the interior into the aperture 80. The tubular component has a containment portion 81, an offset portion 83, and port portion 85. Elastomeric grommet 77 may be sealingly placed in the lower portion 94 of the tubular component and a check valve 62 may be placed therein. A cylindrical shaped filter and/or getter media material 100 may be included in the containment portion and is configured to conform to the interior of the tubular component. Said tubular component has a plurality of axially-extending apertures 110 configured as horizontal slots disclosed therein. In a preferred embodiment, there may be a slit for each wafer with the slit position to discharge purge gas over the surface of the respective wafer. The media material, if in the containment portion, is thus exposed to the interior of the wafer container by way of said axially-extending openings. Of particular note of this container portion 64 is the rearward compartments 111 that are defined by rearward protrusions 112 at the back 67.1. The wall 113 is configured to provide two feet 114 when the container is tipped rearward 90 degrees whereby the front with door 24 is upward, such as for shipping. Each compartment 111 has a pair of sidewall portions 115, a back wall portion 116 and a compartment opening 117.

Referring to FIGS. 5 and 6, the tubular component 119 in this embodiment has vertical slits and has a plurality of fingers 122 that extend downwardly into the apertures 80 through the shell and kinematic coupling plate 74. Said fingers resiliently flex radially inward and allow a secure fit in the aperture in the bottom of the container portion. A flange 113 may facilitate proper seating of the component.

Figure 7:
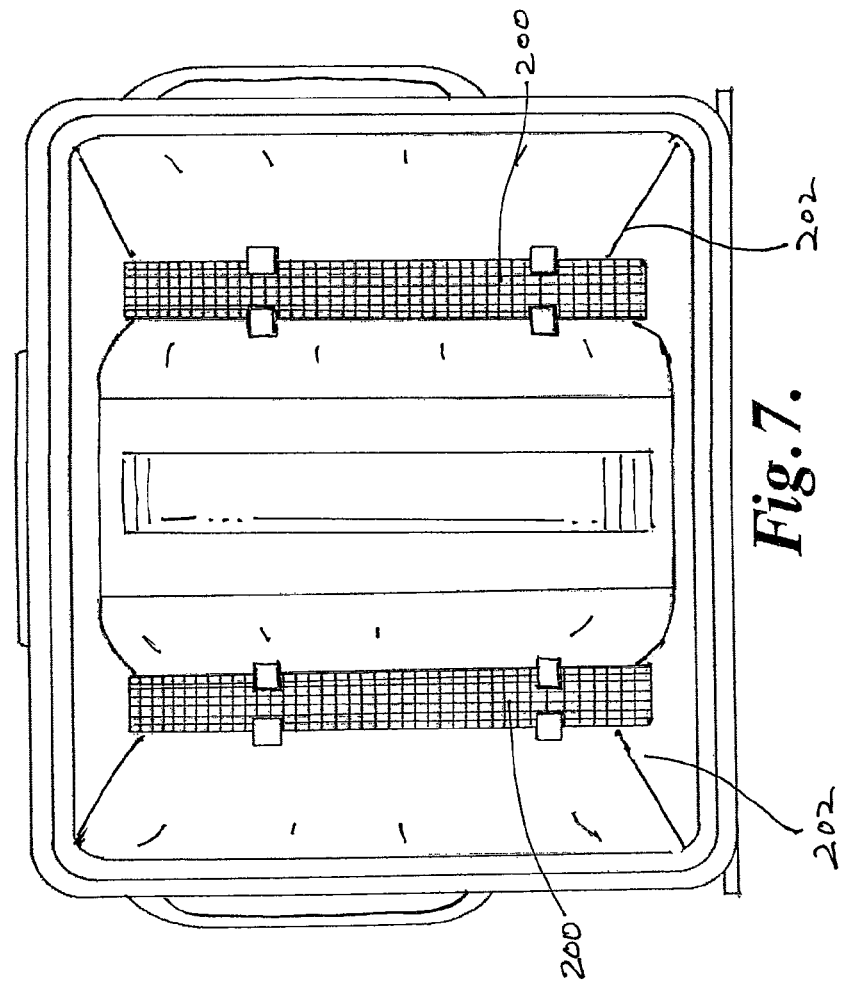
FIG. 7 is a front elevation view of a container portion with a pair of tubular environmental control components configured as filter cartridges mounted therein with brackets.

Referring to FIGS. 7-11, additional embodiments are depicted with a pair of tubular environmental control components configured as filter cartridges 200 mounted in approximately the same position, in rearward 3-sided compartments 202, and configured as getters without the associated active purge capability of the containers illustrated in FIGS. 1-4. Such cartridges may have an outer housing 210 formed of a polymer or other suitable material with media 211 positioned therein. In a preferred embodiment the cartridge and media will be tubular shaped. Bosses 212 on the cartridge of FIG. 8 can be utilized to attach the cartridge directly to the container portion wall by way of screws extending through the exterior wall. Alternatively the bracket 220 as illustrated in FIG. 9 and FIG. 7 may be attached to the back wall of the container portion with the cartridge clamped therein.

Referring in particular to FIGS. 10, 11 and 12 a further embodiment of a filter cartridge 300 is illustrated and again has media 304 closed within a housing 308. The cartridge 300 is clamped within the clamp 320 which has resilient catch legs 330 with tabs 322 which can bite into the walls of the container simply by insertion therein with no further attachment mechanisms. Spring arms 335 secure the cartridge in the bracket.

Specific getter media which may be utilized in the cartridges and the towers illustrated herein is disclosed in international publication no. WO 2007/149513 A2 which is incorporated herein by reference. Similarly the methodology and system for recharging a getter that is part of a purge system within the wafer container as illustrated herein in FIGS. 2, 3 and 4 are described in detail with reference primarily to a reticle pod in said publication. Said systems and methodologies and equipment are also applicable herein and said references incorporated for the disclosure relating directly thereto.

Referring to FIGS. 14-18, details of a tubular environmental control component 400 in accord with the inventions herein is illustrated. The component has a pair of elongate portions 402, 406 that assemble together to form a containment portion 410 with a containment interior 414. The containment portion has an axis 418 and connects to an offset portion 422 that connects to a purge port portion 428. An elastomeric grommet 432 may fit in a grommet receiver 440. The two elongate portions are configured as elongate clam shell portions. A rearward portion 406 has edge portions 444 with latch portions 448 configured as loops. The forward portion 402 also has edge portions 448 with latch portions 452 configured as tabs to engage the loops. The latch portion operates to secure the elongate portion together while allowing disassembly for cleaning or media placement or replacement. The forward portion 402 has an aperture portion 451 with a plurality of apertures 453 that provide communication between the containment interior 414 and the open interior of the container portion.

Referring in particular to FIGS. 13-18, an elastomeric elongate blocking member 460 is configured as a strip to engage the aperture portion by having tabs 464 fit into and seal the aperture 453. FIGS. 13 and 18 illustrate the member 460 in a blocking position. Thus, the blocking member can selectively block or expose the interior of the containment portion to the interior of the container portion.

Referring still to FIGS. 13-18, an elastomeric retainer, configured as an elastomeric cap 500, resiliently expands and fits over the upper end portion 506 of the tubular component 400. The cap 500 has a dome shape and has an extension portion 516 that is configured to engage the interior surface 520 of the container portion at the top. The cap functions to secure the elongate portions together and further to engage resiliently the container portion whereby the vibration of tubular component and plastic to plastic contact, the plastic component portion and the shell, is minimized. The tubular component is inserted putting the cap under compression and the high friction between the elastomeric material of the cap and the hard plastic of the shell, typically polycarbonate, holds the tubular component in place.

Referring to FIGS. 19 and 20, another embodiment of the tubular environmental control component 600 is shown. The component has two clam shell portions 604, 606 that are hinged together by a living hinge 610 or the like. The two shell portions may be latched with latch portions. Apertures 630 provide communication between the interior 634 of the capsule portion or containment portion 644 and the open interior of the wafer container. The containment portion also may connect to an offset portion 650 and then to a purge port portion 654.

Referring to FIG. 21, an embodiment of a wafer container 692 with a tubular environmental control component 700 is placed in recesses 710 on the backside wall 714 of the container portion 718. The recesses may have apertures positioned and spaced from the top 720 to the bottom 722. Offset portion 726 may provide communication between the containment portion 730 and the purge port portion (not shown) positioned in the interior. This arrangement allows the tubular environmental control components to be changed without disturbing the interior of the container portion to the same level as some of the other embodiments.

Referring to FIG. 22, an alternative embodiment of a blocking member 800 is illustrated. This rigid plastic, for example polycarbonate, piece clamps around a tubular environmental control component, such as the configuration of FIG. 19. Gripping fingers 810 may secure the member to the tubular member by locking on to the rear corner 670 with wedge shape teeth 812. In a further embodiment the blocking member may have apertures 820 that correspond with the apertures 630 on the tubular component. This component can then slidably engage with the tubular environmental control component by sliding vertically, can open, close or adjust the communication between the interior of the tubular component and the interior of the container portion. Similarly shaped rigid blocking components can have arcuate fingers that partially wrap around the tubular components with cylindrical or oval cross-sectional shapes.

The present invention may be embodied in other specific forms without departing from the spirit of the essential attributes thereof; therefore, the illustrated embodiments should be considered in all respects as illustrative and not restrictive, reference being made to the appended claims rather than to the foregoing description to indicate the scope of the invention.

The invention claimed is:

1. A front opening wafer container for wafers 300 mm and larger, the container comprising:
   a container portion having container wall that extends around a closed left side, a closed right side, a closed bottom, a closed top, and a closed backside defining an open interior, the container portion having a plurality of horizontal wafer shelves spaced apart, affixed therein and defining a generally cylindrical wafer receiving region in the open interior for holding a stack of horizontal spaced apart wafers seated in the shelves, a door frame defining an open front, wherein the container portion wall at the back side has a inwardly extending recess extending from the top of the container portion to the bottom of the container portion, at both lateral sides of the recess a protruding portion of the shell defines a pair of upright feet for seating the wafer container when the wafer container is rotated backwardly with the open front facing upwardly, the feet defining interior compartments,
   each compartment having a pair of opposing side wall portions, a back wall portion, two interior vertical corners, a top wall portion and a bottom wall portion;
   a door to fit in the open front and latchable to the door frame;
   at least one elongate tubular environmental control component, secured within one of said compartments and being spaced from the pair of side wall portions and the back wall portion, the elongate tubular environmental control component having a length and the length extending substantially a distance between the top wall portion and the bottom wall portion, wherein the elongate tubular environmental control component has an axis that is upright and the elongate tubular environmental control component is connected to the bottom of the container portion at a purge port that is offset from the axis of the tubular environmental control component.

2. The front opening wafer container of claim 1 wherein the elongate tubular environmental control component is comprised of two elongate portions, each elongate portion connected by a plurality of latches for securing the elongate portions together, the two portions defining a containment region.

3. The front opening wafer container of claim 2 wherein the two elongate portions together defining a containment portion and the containment portion contains at least one of a filtration material or a vapor absorbent material.

4. The front opening wafer container of claim 1 wherein the elongate tubular environmental control component has a containment portion with an interior and a plurality of apertures providing communication between the interior of the containment portion and the open interior of the container portion.

5. The front opening wafer container of claim 4 further comprising an elongate blocking member that is positionable on the tubular environmental control component to selectively obstruct the communication between the interior of the containment portion and the open interior of the container portion.

6. The front opening wafer container of claim 5 wherein the elongate blocking member is formed of an elastomeric material and the tubular environmental control component has attachment structure extending around the plurality of apertures and said blocking component resiliently engages to said attachment structure to sealingly block the communication between the interior of the containment portion and the open interior of the container portion.

7. The front opening wafer container of claim 1 wherein the elongate tubular environmental control component is comprised of two elongate portions defining a containment portion, and wherein the elongate tubular control component further comprises an elastomeric cap that resiliently expands to adheringly cover the top of the containment portion.

8. The front opening wafer container of claim 1 further comprising an additional elongate tubular environmental control component located in an interior compartment and wherein the two elongate tubular environmental control components are both connected to a purge inlets on the bottom of the wafer container, and wherein the wafer container has a further purge inlet positioned on the bottom of the wafer container proximate to the door frame, and further comprises a purge outlet on the bottom of the wafer container proximate the door frame.

9. The front opening wafer container of claim 1, wherein the elongate tubular environmental control component is comprises an elastomeric cap that resiliently expands to adheringly cover the top of the containment portion and wherein the cap has a shell engaging portion whereby the tubular environmental control component has two opposing ends and is secured at both ends to the container portion.

10. A front opening wafer container for wafers 300 mm and larger, comprising:
   a container portion having container wall that extends around a closed left side, a closed right side, a closed bottom, a closed top, and a closed backside defining an open interior, the container portion having a plurality of horizontal wafer shelves spaced apart, affixed therein and defining a generally cylindrical wafer receiving region in the open interior for holding a stack of horizontal spaced apart wafers seated in the shelves, a door frame defining an open front, wherein the container portion wall at the back side has a pair of corner regions extending from the top of the container portion to the bottom of the container portion;

a door to fit in the open front and latchable to the door frame;

a pair of elongate tubular environmental control components positioned in the corner regions, each elongate tubular environmental control component having a containment portion with an interior and a plurality of apertures providing communication between the interior of the containment portion and the open interior of the container portion, and wherein each of the elongate tubular environmental control component has an axis that is upright and the elongate tubular environmental control component is connected to the bottom of the container portion at a purge port that is offset from the axis of the tubular environmental control component.

11. The front opening wafer container of claim 10 the pair of elongate tubular environmental control are spaced from the wall portions and the back side and the elongate tubular environmental control component has a length and the length extends substantially a distance between the top wall portion and the bottom wall portion.

12. The front opening wafer container of claim 10 wherein each elongate tubular environmental control component is comprised of two elongate portions, each elongate portion connected to the other by at least one of a plurality of latches and hinges, the two portions defining a containment portion.

13. The front opening wafer container of claim 12, further comprising an elongate blocking member that is positionable on at least one of the tubular environmental control component to selectively obstruct the communication between the interior of the containment portion and the open interior of the container portion.

14. The front opening wafer container of claim 13, wherein the elongate blocking member is formed of an elastomeric material and the tubular environmental control component has attachment structure extending around the plurality of apertures and said blocking component resiliently engages to said attachment structure to sealingly block the communication between the interior of the containment portion and the open interior of the container portion.

15. The front opening wafer container of claim 10 wherein the elongate tubular environmental control components are each comprised of two elongate portions defining a containment portion, and wherein the elongate tubular control component further comprises an elastomeric cap that resiliently expands to adheringly cover the top of the containment portion.

16. The front opening wafer container of claim 7 wherein the cap has a shell engaging portion whereby the tubular environmental control component has two opposing ends and is secured at both ends to the container portion.

17. The front opening wafer container of claim 10 wherein each of the containment portions has therein at least one of a filter material and an absorbent material.

18. A front opening wafer container for wafers 300 mm and larger, the wafer container comprising:

a container portion having container wall that extends around a closed left side, a closed right side, a closed bottom, a closed top, and a closed backside defining an open interior, the container portion having a plurality of horizontal wafer shelves spaced apart, affixed therein and defining a generally cylindrical wafer receiving region in the open interior for holding a stack of horizontal spaced apart wafers seated in the shelves, a door frame defining an open front, wherein the container portion wall at the back side has a pair of corner regions extending from the top of the container portion to the bottom of the container portion;

a door to fit in the open front and latchable to the door frame;

an elongate tubular environmental control component positioned in one of the corner regions, said elongate tubular environmental control component having a containment portion with an interior and a plurality of apertures providing communication between the interior of the containment portion and the open interior of the container portion, and wherein said elongate tubular environmental control component has an axis that is upright and the elongate tubular environmental control component is connected to the bottom of the container portion at a purge port that is offset from the axis of the tubular environmental control component, and wherein the elongate tubular environmental control component is comprised of two elongate portions, each elongate portion connected to the other by at least one of a plurality of latches and hinges, the two portions defining a containment portion.

19. The front opening wafer container of claim 18 wherein the containment portion has therein at least one of a filter material and an absorbent material.

20. The front opening wafer container of claim 18 further comprising an elongate blocking member that is positionable on the tubular environmental control component to selectively obstruct the communication between the interior of the containment portion and the open interior of the container portion.

21. The front opening wafer container of claim 20, wherein the elongate blocking member is formed of an elastomeric material and the tubular environmental control component has attachment structure extending around the plurality of apertures and said blocking component resiliently engages to said attachment structure to sealingly block the communication between the interior of the containment portion and the open interior of the container portion.

22. The front opening wafer container of claim 18 wherein the elongate tubular environmental control component is further comprised an elastomeric cap that resiliently expands to adheringly cover the top of the containment portion.

23. The front opening wafer container of claim 22 wherein the cap has a shell engaging portion whereby the tubular environmental control component has two opposing ends and is secured at both ends to the container portion.

24. The front opening wafer container of claim 18 wherein each of the containment portions has therein at least one of a filter material and an absorbent material.

25. A front opening wafer container comprising:

a container portion having container wall that extends around a closed left side, a closed right side, a closed bottom, a closed top, and a closed backside defining an open interior, the container portion having a plurality of horizontal wafer shelves spaced apart, affixed therein and defining a generally cylindrical wafer receiving region in the open interior for holding a stack of horizontal spaced apart wafers seated in the shelves, a door frame defining an open front, wherein the container portion wall at the back side has a pair of corner regions extending from the top of the container portion to the bottom of the container portion;

a door to fit in the open front and latchable to the door frame;

an elongate tubular environmental control component positioned in the container portion and extending substantially from the bottom of the container portion to the top of the container portion, said elongate tubular environmental control component having a containment portion with an interior and a plurality of apertures providing communication between the interior of the containment portion and the open interior of the container portion, and wherein said elongate tubular environmental control component has an axis that is upright and is connected to the bottom of the container portion at a purge port and wherein the elongate tubular environmental control component is further comprised of an elongate blocking member that is positionable on the tubular environmental control component to selectively obstruct the communication between the interior of the containment portion and the open interior of the container portion.

26. The front opening wafer container of claim 25 wherein the elongate blocking member is formed of an elastomeric material and the tubular environmental control component has attachment structure extending around the plurality of apertures and said blocking component resiliently engages to said attachment structure to sealingly block the communication between the interior of the containment portion and the open interior of the container portion.

27. The front opening wafer container of claim 25 wherein the elongate tubular environmental control component is further comprised a cap formed of elastomeric material that resiliently expands to adheringly cover the top of the containment portion.

28. The front opening wafer container of claim 27 wherein the cap has a shell engaging portion whereby the tubular environmental control component has two opposing ends and is secured at both ends to the container portion.

* * * * *